(12) United States Patent
Nakamura et al.

(10) Patent No.: US 6,533,123 B1
(45) Date of Patent: *Mar. 18, 2003

(54) SEMICONDUCTOR WAFER RETAINING STRUCTURE

(75) Inventors: Akira Nakamura, Ashikaga (JP); Masahiko Fuyumuro, Ashikaga (JP)

(73) Assignee: Achilles Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/846,256

(22) Filed: Apr. 30, 1997

(30) Foreign Application Priority Data

Aug. 30, 1995 (JP) ............................................. 7-24277
Jul. 15, 1996 (JP) ............................................. 8-204261

(51) Int. Cl.⁷ ............................................. B65D 85/30
(52) U.S. Cl. ........................ 206/710; 206/454; 206/303
(58) Field of Search ........................ 206/710–711, 543, 206/544, 523, 303, 453–456; 706/334; 118/500

(56) References Cited

U.S. PATENT DOCUMENTS

| | | | | |
|---|---|---|---|---|
| 3,392,824 A | * | 7/1968 | Flynn | 206/594 |
| 3,461,537 A | * | 8/1969 | Lotz | 438/46 |
| 4,203,127 A | * | 5/1980 | Tegge, Jr. | 206/710 |
| 4,787,508 A | * | 11/1988 | Wu et al. | 206/710 |
| 4,886,162 A | * | 12/1989 | Ambrogio | 206/710 |
| 5,366,079 A | * | 11/1994 | Lin et al. | 206/710 |
| 5,551,571 A | * | 9/1996 | Lin et al. | 206/710 |
| 5,553,711 A | * | 9/1996 | Lin et al. | 206/710 |
| 5,759,006 A | * | 6/1998 | Miyamoto et al. | 414/416 |

* cited by examiner

Primary Examiner—Mickey Yu
Assistant Examiner—Jila Mohandesi
(74) Attorney, Agent, or Firm—Kanesaka & Takeuchi

(57) ABSTRACT

A semiconductor wafer retaining structure includes a container made of a conductive material in which a plurality of semiconductor wafers is stacked and contained, spacer sheets put between the semiconductor wafers, and end-cushioning materials put to the upper and bottom end portions of the semiconductor wafers thus stacked and contained. Slits are formed in the container for transferring the semiconductor wafers in and from the container by a robot.

7 Claims, 7 Drawing Sheets

SEMICONDUCTOR WAFER RETAINING STRUCTURE

CROSS REFERENCE TO RELATED APPLICATIONS

This is a continuation application of PCT/JP96/02441.

BACKGROUND OF THE INVENTION AND RELATED ART STATEMENT

This invention relates to a disk-like semiconductor wafer retaining structure, and more particularly relates to such a semiconductor wafer retaining structure to prevent impact breakage of the semiconductor wafers during transportation and static electricity caused by friction thereof.

In general, semiconductor wafers (hereinafter simply referred to as wafers) are prepared by cutting a silicon monocrystal ingot into thin disks of, for exsample, about two to eight inches in diameter. The wafers are allowed to apply many circuits such as LSI and cut into chips, which are then packaged to form a semiconductor device.

Each process for cutting such an ingot into wafers, forming circuits on the wafer surface and cutting the wafers into chips to package is often conducted independently at different sites. Generally, a container is used to transfer the wafers from one site of a specific step to the other site. Further, the wafers should be carefully put in the container because electrostatic damage or effect to the wafer surface where circuits are formed would decrease the yield.

In a conventional containing structure, many grooves are formed on an inner wall surface of a specific container so as to put the wafers between such grooves. It is also known to stack each wafer in order through polyethyle films in the specific container so as to form a containing structure.

In the case of the above mentioned first containing structure where many grooves are formed in the inner wall surface of the container, however, mechanical vibration during transportation or accidental drop impact is transmitted to the wafers through the container, thereby the wafers being physically or mechanically damaged. While, in the case of the second containing structure where each wafer is stacked through polyethylene films, the wafers and the films tend to move slightly each other due to mechanical vibration during transportation. Static electricity is generated by such slight movement and charged on the polyethylene films and the wafers, which would damage circuits on the wafers when the electricity is discharged.

Further, when the wafers are put in and out of the container by hand, the wafers would be damaged due to, for example, malfunction. Accordingly, it is preferable to use an automatic control mechanism to put the wafer in and out, but an introduction thereof to conventional containers makes the system more complicated.

It is an object of the present invention to provide a wafer containing structure in which the above mentioned conventional problems are solved so as to prevent a physical and electrical damage of wafers caused by impact during transportation.

A further object of the present invention is to provide a wafer containing structure which can avoid an inconvenient situation where wafers and spacer sheets are united when they are put out of a container because of close and tight contact.

SUMMARY OF THE INVENTION

A wafer containing structure of the present invention comprises a container made of a conductive material in which a plurality of semiconductor wafers is stacked and contained, spacer sheets put between the semiconductor wafers and end-cushioning materials put to upper and bottom end portions of a plurality of the semiconductor wafers thus stacked and contained.

The container may be formed by monolithically molding a conductive filler-added conductive plastic material or a polymer alloy-treated conductive plastic material. The conductive filler to be added includes carbon black, graphite carbon, carbon fiber, metal powder, metal fiber, powdery metal oxide, metal-coated inorganic fine powder, organic fine powder and organic fiber, surface resistance of the container being preferably $10^6$ $\Omega/\square$ or less.

The spacer sheets are generally made of paper, synthetic paper, synthetic resin films, synthetic resin foam sheets and the like. These spacer sheets may either be electrically conductive or non-conductive. When the spacer sheets are conductive, surface electrical resistance is preferably $10^6$ $\Omega/\square$ or less. There may be used polyolefin synthetic paper which contains dispersed conductive fiber such as conductive plastic-conjugated fiber of polypyrrole, polyaniline, carbon fiber and metal-coated fiber; or films or foam sheets of polyethylene, polypropylene, polyethylene phthalate added with conductive fillers, as mentioned above, or anti-static agents.

Although the spacer sheets may either be mono- or multi-layer structure of the above mentioned material such as synthetic paper, the mono-layer structure is preferable from a standpoint of handling and other properties.

Also, synthetic paper of polypyrrole-conjugated fiber is preferable from a standpoint of easy control of conductivity, durability and the like.

The spacer sheets preferably have air permeability of 1,800 sec/100 cc or less according to Japanese Industrial Standard (JIS) P8117, smoothness of 10 sec or less according to JIS 8119 and dust repellency of 200 particles (>0.5 $\mu$m)/100 mm×100 mm or less according to the Japan CIC Company Standard.

In the containing structure of the present invention, the spacer sheets are put between the wafers (or stacked each other) under a containing condition, as described above.

The container may be vacuum-packed as a whole for a purpose of dust-proof when the wafers are contained in accordance with the containing structure.

In general, as the surfaces of the wafers are extremely smooth, the spacer sheets and the wafers would adhere tightly and come into contact with each other under a practically airless condition.

Because of this, thus adhered wafers and spacer sheets are not easily separated when they are put out of the container in order and it is troublesome to strip off the wafers by hand from the spacer sheets one by one. Particularly, in the case of an automatic control system as will be described bellow, a situation where the wafers and the spacer sheets adhere tightly would result in problems when they are put in and out.

According to the structure of the present invention, it is possible to essentially avoid the above mentioned situation so as to solve conventional problems. Even if the wafers and the spacer sheets adhere to each other, such a trouble can be easily removed by the structure of the present invention.

Each of the spacer sheets may be formed to provide a plurality of concave portions and/or convex portions on at least one surface, or to provide cut-lines extending from a periphery to inside thereof. The concave and/or convex portions may typically be formed by an embossing process. The cut-lines may typically be formed by a cutter or a clicker of certain width.

There may be used soft polyurethane foam, polyethylene foam, polypropylene foam, polystyrene foam and the like as the end-cushioning material. Closed-cell foam is preferable to shut out the dust from outside, while soft polyurethane is desirable from a standpoint of cushioning properties. The cushioning material may be electrically conductive, surface resistance thereof being preferably $10^{11}$ Ω/□ or less. When the end-cushioning material is not conductive, it is preferable to arrange the conductive spacer sheets at the uppermost wafer and the bottom one.

According to the containing structure of the present invention, each end-cushioning material is put on the top end portion and under the bottom end portion of the spacer sheets and the wafers stacked one after the other to contain them in the container.

It is preferable to use a cushioning material having 10%-compressive stress of about 0.01 to 0.6 kg/cm². For example, polyurethane foam of about 0.01 to 0.03, polyethylene foam of about 0.2 to 0.4, and polystyrene foam of about 0.2 to 0.4 kg/cm² are preferably used.

In the above mentioned wafer container structure of the present invention, the wafers and the spacer sheets are stacked one after the other and contained in the container with the end-cushioning materials put on the top and under the bottom ends. Accordingly, vibratory impact to the wafer container during transportation can be absorbed by the end-cushioning materials, thereby protecting the wafers from such impact.

When a conductive material is used as the spacer sheets, no static electricity generates if friction is created between the wafers and the spacer sheets or between the wafers and the end-cushioning material. Even if the static electricity happens to generate, such electricity does not remain in the container. As a result, any circuit formed on the wafer never be inconveniently damaged by the static electricity.

Further, each wafer can be stably contained in the container without any mutual displacement thereof because the spacer sheets and the wafers are stacked one after the other and retained from both of the upper and the bottom directions in the container. Thus, contact breakage of the wafers to the inner surface of the container or static electricity caused by friction of mutual wafer can be controlled more effectively.

The surface resistance of the container is preferably $10^6$ Ω/□ or less so as to rapidly release static electricity generated in the container or to prevent an effect of external electric field.

In the containing structure of the present invention, the container is provided with the cylindrical portion for putting the wafers therein, which may have slits to receive pickup arms for putting the wafers or the spacer sheets in and/or out thereof. These slits make it possible to easily put the wafers and the conductive sheets in and/or out of the container.

According to the present invention, there is provided a method for putting the wafers in and/or out of the container in which the wafers and the spacer sheets are put in and/or out of a cylindrical portion of a container main body, the cylindrical portion having at least one slit thereon, by means of one or two pickup arms. The present method is adaptable to an automatic controlling mechanism.

When one pickup arm is used, the arm enters into at least one slit and put each wafer and spacer sheet in the cylinder portion or put out therefrom.

When two pickup arms are used, one of the two arms enters into the slit, while the other one enters into the same or another slit. Each of the wafers and spacer sheets is put in or put out of the cylinder portion by means of these two pickup arms.

According to the present method for putting the wafers in and/or out of the container, the container provided with the slitted cylinder is used, which makes a head portion of the pickup arm to enter into inner portion of the cylinder when the wafers are put in and/or out of the cylinder of a container. Accordingly, if the number of the wafers increases gradually when they are put in, or if number thereof decreases gradually when they are put out, control of the pickup arm is quite easy in an automatic control mechanism.

BRIEF DESCRIPTION OF DRAWINGS

FIGS. 6(A) and 6(B) are schematic views in which structure does not cause any adhesion with wafers, or breaks off such an adhesion if occurred, wherein FIG. 6(A) shows a spacer sheet which surface is embossed, and FIG. 6(B) shows a spacer sheet with a plurality cut lines extending from outside to inside thereof;

DETAILED DESCRIPTION OF PREFERRED EMBODIMENTS

Figure 1:
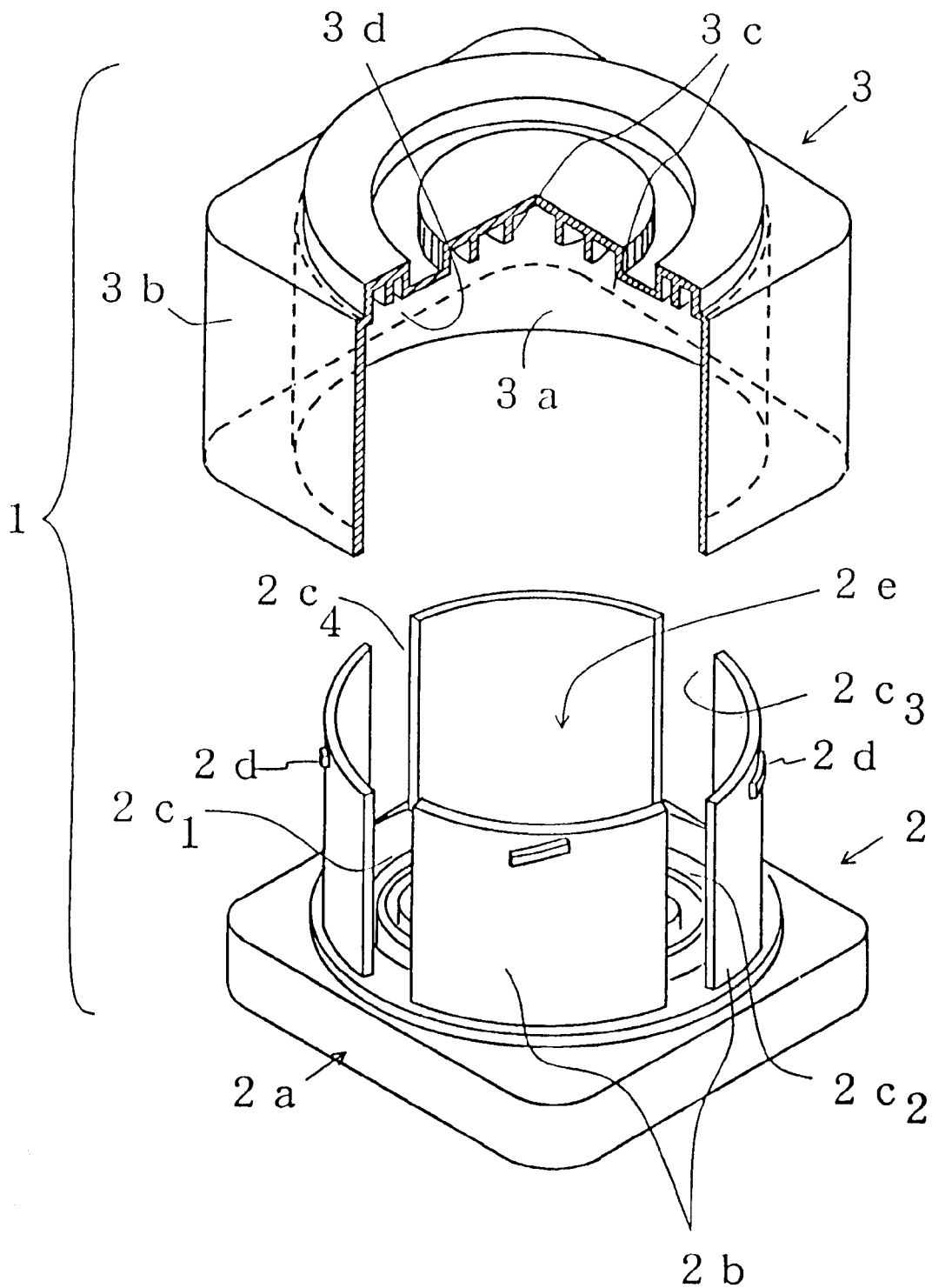
FIG. 1 is a partially cutaway perspective view of an example of a wafer container used for a retaining structure of the present invention.

The present invention will be described in accordance of the drawing.

Figure 2:
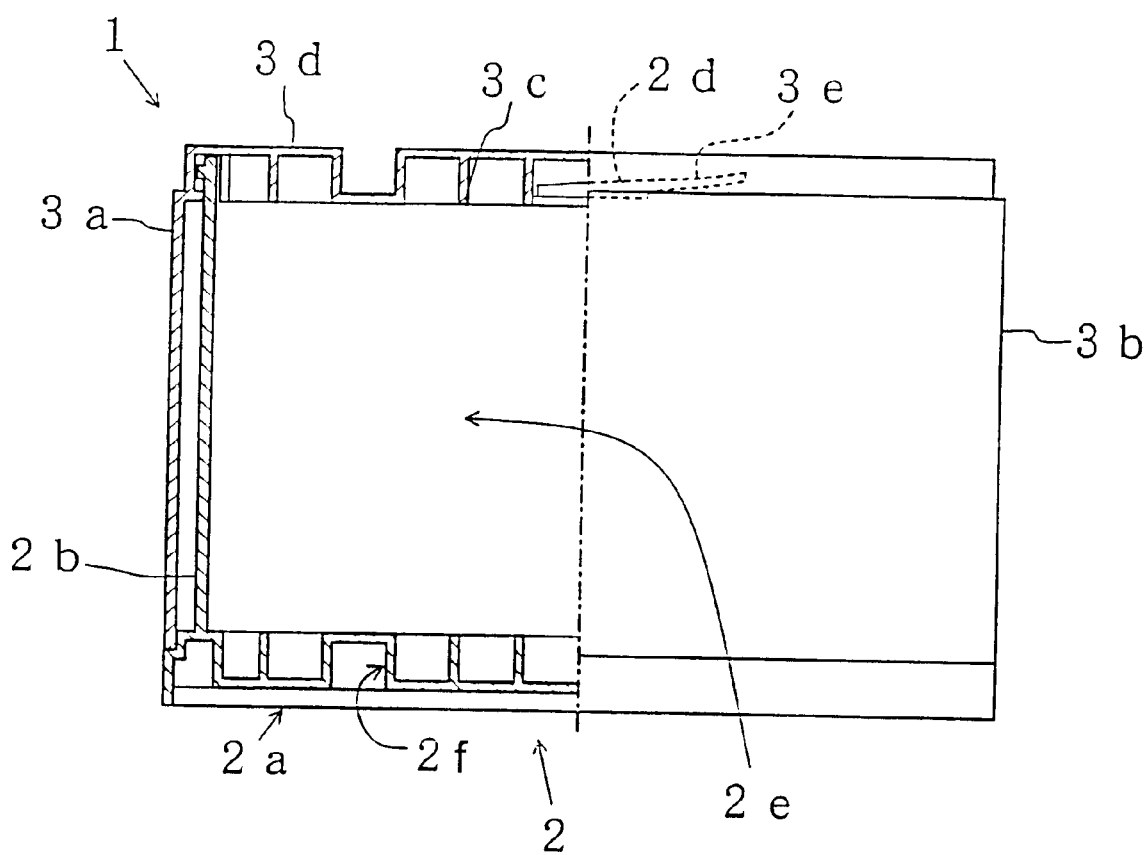
FIG. 2 is a semi-vertical side view of a wafer container of FIG. 1.

FIG. 1 is a partially cutaway perspective view of an example of a container used for a wafer retaining structure of the present invention and FIG. 2 is a semi-vertical side view thereof. In FIGS. 1 and 2, a wafer container 1 comprises a bottomed cylindrical container main body 2 for containing a plurality of stacked disk-like wafers and a lid body 3 to be put on the container main body 2.

In the container main body 2, a cylindrical portion 2b is formed on a square base portion 2a to contain a plurality of stacked wafers. An inner diameter of the cylindrical portion is nearly several mm larger than that of the wafers to be contained. The cylindrical portion 2b has slits 2c1 to 2c4 extending from the top to the bottom at circumferentially quadrisected positions on the base portion. Width of these slits 2c1 to 2cd is wide enough to pass a pickup arm of a carrier robot therethrough as will be described in a putting in and/or out system. Each slit is preferably positioned in the center of each side of the base portion to shorten a stroke of the pickup arm. Each slit may also be positioned on diagonal lines of the base portion depending on a system to be used.

Four slant protrusions 2d are formed as stoppers at nearly equal spaces on the top of the outer surface of the cylindrical portion 2b, which are aligned at an inclined position with slant slots 3e formed inside of a circular channel 3d of the lid body 3. The container main body 2 or the lid body 3 can slightly turn round to fix both bodies. The base portion 2a of the container main body 2 has a concave-convex upper surface (or an inner surface facing inside of the container) comprising a plurality of reinforcing concentric ribs 2f of same height as shown in FIG. 2, where the wafers are put horizontally.

On the other hand, the lid body 3 has an external shape of square pole as a whole and comprises a cylindrical portion 3a and a square pole portion 3b circumscribed to the portion 3a. The cylindrical portion 3a covers the cylindrical portion 2b of the container main body 2, while leaving a part of the base portion 2a of the main body 2 uncovered by a bottom portion of the cylindrical portion 3a. The cylindrical portion 3a plays a role as guide means when the lid body is attached to or detached from the container main body 2.

On an inner top surface of the lid body 3, the circular channel 3d is formed to receive an upper end of the cylindrical portion 2b of the container main body 2, while a plurality of concentric ribs and convex portions (hereinafter simply referred to as ribs 3c) is formed as downward extrusions corresponding to a containing space 2e of the container main body 2. These ribs 3c contact an upper portion of the stacked wafers in a situation where the lid body 3 is attached to the container main body 2 and the ribs 3 are slightly advanced into an upper portion of the containing space 2e. According to the present invention, however, the upper portion of the stacked wafers may simply be pressed downward by the inner surface of the lid body 3, and accordingly, it is not necessarily essential to form the ribs 3c and advance into the containing space 2e.

The lid body 3 is detachably fitted to the container main body 2 by aligning the slant protrusions 2d with the slant slots 3e formed inside of the circular channel 3d. In more concrete terms, the lid body 3 is capped on the cylindrical portion 2b at a inclined position to the container main body 2 and advanced or turned into the body 2 within an angle of the slant slots by turning round the lid body 3 at a predetermined angle (15° to 45°), thereby both bodies being gradually fixed to each other. The under surface of the container main body 2 is indented inside to receive the upper portion of the lid body 3, which allows the wafer container 1 to stack a number of wafers therein in the vertical direction.

A conductive polypropylene resin having volume resistance of 200 Ωcm, and surface resistance of $10^6$ Ω/□ was used in the above embodiment.

Figure 3:
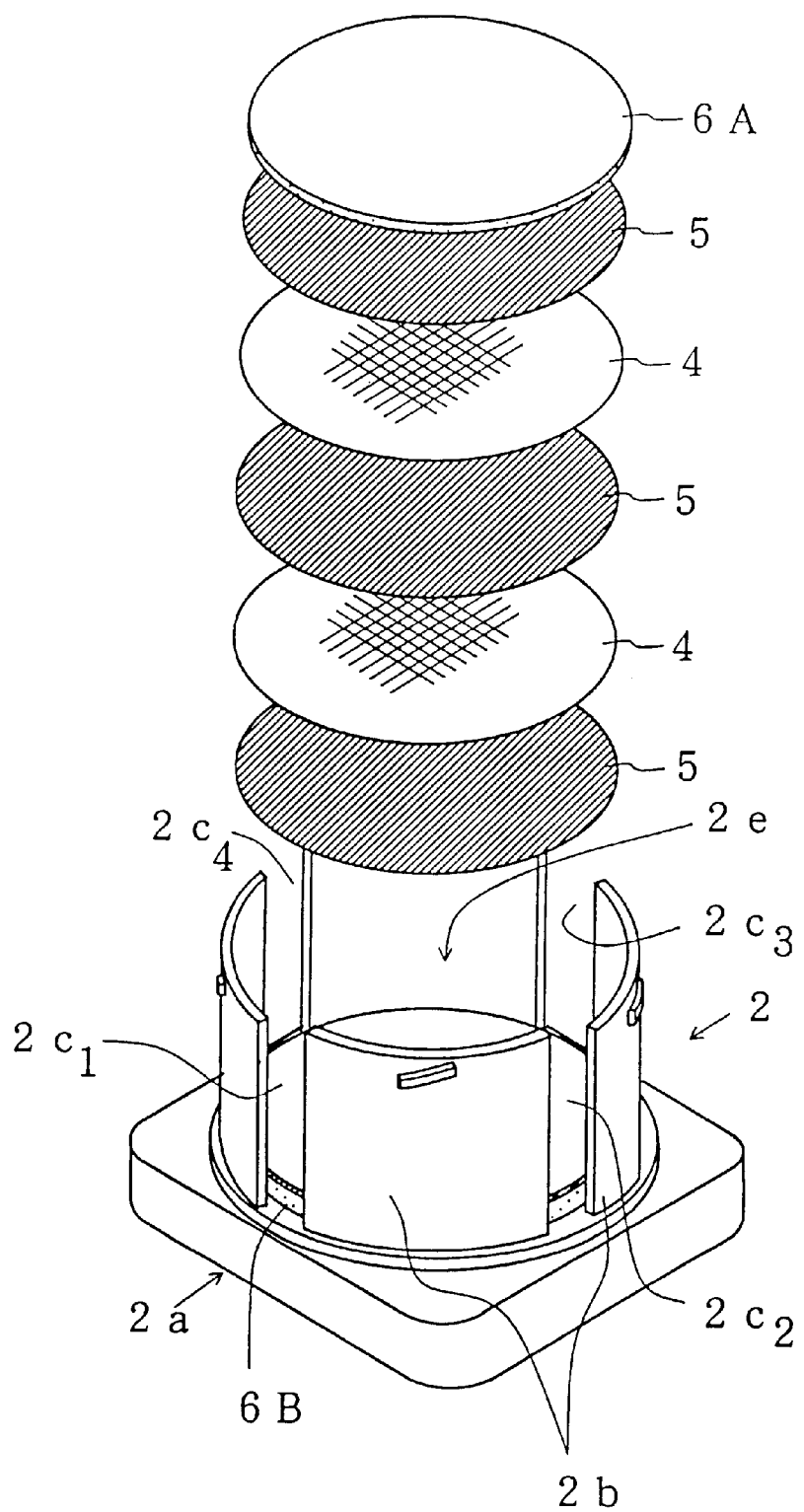
FIG. 3 is a perspective view of an example of a retaining structure of the present invention.
Figure 4:
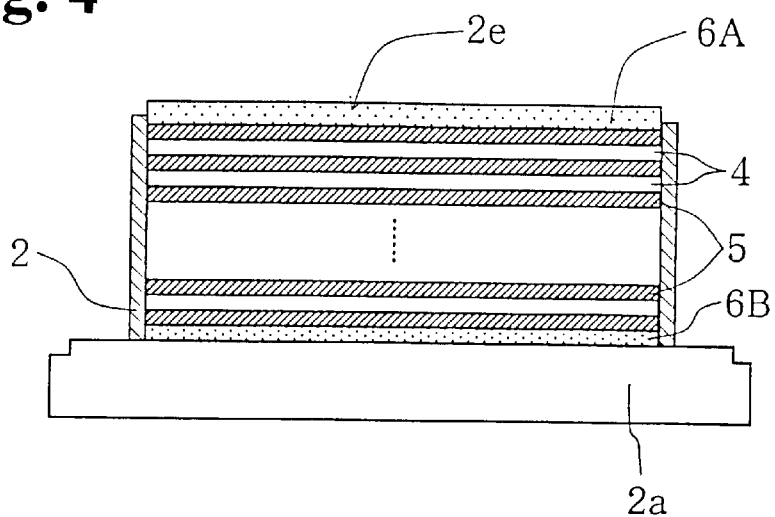
FIG. 4 is a schematic sectional side view of a container shown in FIG. 3 with wafers put therein.
Figure 5:
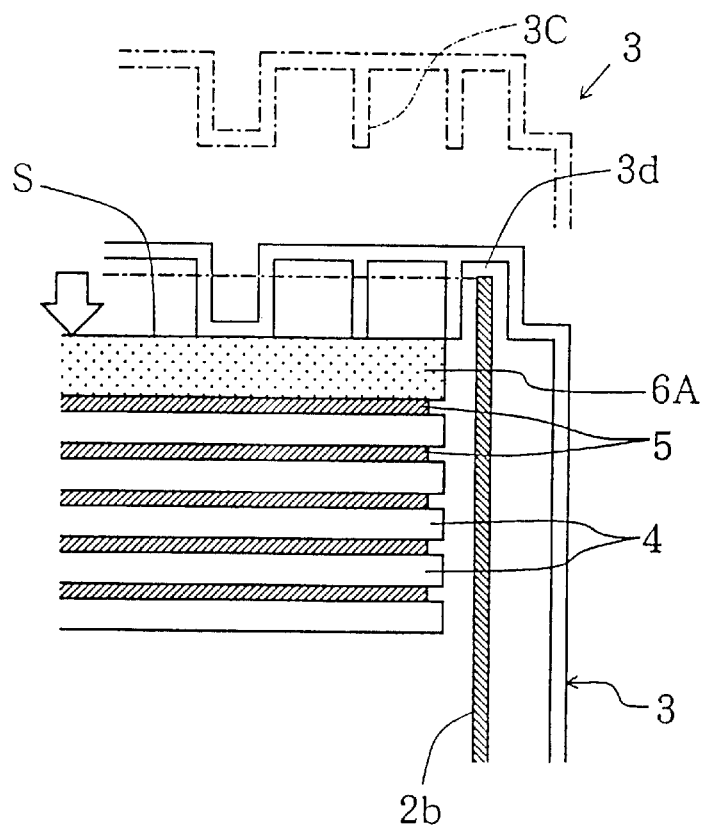
FIG. 5 is a partially enlarged sectional view of the retaining structure of the present invention with wafers contained therein.

An embodiment in which a plurality of wafers is contained in the wafer container 1 will be described in the following. FIG. 3 is a perspective view of the container main body 2 containing wafers therein. FIG. 4 is a vertical sectional view of the container main body 2 containing the wafers. FIG. 5 is a partially enlarged sectional view of FIG. 2 showing the wafers contained in the wafer container 1.

In these figures, a plurality of wafers 4 is stacked and contained in the containing space 2e of the container main body 2, while a spacer sheet 5 (a monolayer conductive sheet in FIG. 3) is put between two wafers 4.

Although a size of the wafers generally varies, for example, a diameter ranging from two to eight inches (about 50 mm to 200 mm) and thickness of 350, 500 and 750 μm depending on a purpose to be used, wafers of 350 μm in thickness and 8 inches in diameter was used in the present embodiment. The wafer container used in the present embodiment is designed to meet the above mentioned size and contain 25 wafers.

The spacer sheets 5 function to prevent direct contact and friction of mutual wafers 4 when they are stacked and to control generation of static electricity between the wafers 4. Thus, the spacer sheets 5 are preferably made of a soft material having surface resistance of $10^6$ Ω/□ or less. The spacer sheets 5 used in the present embodiment were made of polyolefin synthetic paper having bending resistance of 80 mm or less and formed into a size of 230 μm in thickness and 300 mm in diameter.

Dust repellency of the spacer sheets 5 should be low enough to keep the wafers clean. The dust repellency (Japan ICI Company Standard) of the spacer sheets 5 used herein was 200 particles (>0.5 μm)/100 mm×100 mm or less.

On the other hand, end-cushioning materials 6A and 6B are put to the uppermost portion and the bottom portion in the containing space 2e of the container main body 2. The wafers 4 and the spacer sheets 5 are stacked one after the other, while the end-cushioning materials 6A and 6B are put to both end portions of thus stacked contents to keep them between the materials. Owing to these end-cushioning materials 6A and 6B, the stacked wafers 4 do not directly contact the bottom base 2 of the container main body 2 and the ceiling ribs 3c of the lid body 3. The end-cushioning materials 6A and 6B are moderately impact absorbable and can absorb impact when the wafer container 1 is impacted, no impact being transmitted to the wafers.

The end-cushioning materials 6A and 6B used in the present embodiment was prepared from a soft polyurethane foam sheet of 200 in diameter and 15 mm in thickness, properties thereof being surface resistance of $8\times10^{11}$ Ω/□ or less, charge voltage decay time (50%) of 1.4 sec or less, density (JIS K6401) of 27 kg/m³, hardness (JIS K6401) of 6.5 kgf and impact resilience (JIS K6402) of 40%. The impact resilience of a soft polyurethane foam sheet as the end-cushioning material is preferably about 20 to 60%.

As has been described, 25 wafers 4 are stacked through the spacer sheets 5 contained in the containing space 2e of the container main body 2 in a situation where the end-cushioning materials 6A and 6B are put to the upper and bottom end portions of the contents as shown in FIG. 4.

In the above mentioned situation, the lid body 3 is put and fixed on the container main body 2 (not shown), thereby the wafers 4 being contained in the container 1 and ready for transporting and storing. When the wafers 4 and the spacer sheets 5 are stacked with the end-cushioning materials 6A and 6B followed by fixing the lid body 3 thereon, the ribs 3c formed on the ceiling surface of the lid body 3 press the end-cushioning material 6A.

In more concrete terms, when the lid body 3 is put on the container main body 2 at an inclined position, the ribs 3c contact the end-cushioning material 6A at this level, while the lid body 3 is turned to securely engage the slant protrusions 2d of the container main body with the slant slots 3e. As the lid body 3 advances in the direction of the stacked layer, the ribs 3c gradually press the end-cushioning materials 6A and 6B downward (see, a blank arrow shown in FIG. 5). When the lid body 3 is completely fixed on the container main body 2, each of the upper and the bottom end-cushioning materials 6A and 6B lose about 10% of the thickness, thereby resulting in stress. The stress functions to hold the stacked wafers 4 so that the wafers 4, the spacer sheets 5 and the end-cushioning materials 6A and 6B are kept stably in the wafer container 1.

As the end-cushioning material 6A is slidably in contact with the ribs 3c by the turning operation of the lid body 3, it is preferable for the end-cushioning material 6A to make a surface S thereof smooth so as not to turn around itself.

Figure 6A:
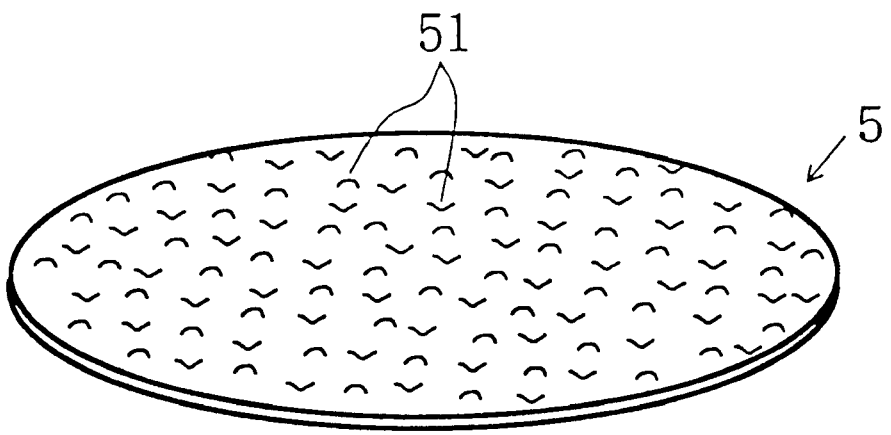

There may be used a spacer sheet structure which does not cause adhesion with the wafers 4 essentially or which releases such an adhesion easily if occurred, as shown in FIGS. 6(A) and (B).

FIG. 6(A) shows a spacer sheet of the above mentioned type having embosses 51 on the surface. The embosses 51 may be formed not only on the above mentioned spacer sheet but on a non-conductive spacer sheet. Further, if a structure thereof does not cause adhesion with the wafers 4 essentially or releases such an adhesion easily if occurred, there may be applied any pattern of the embosses 51 on the spacer sheet, such as a scattering pattern as shown in FIG. 6(A), extending from the center of the sheet to outside, or stripes or lattice-like one.

Apparent thickness of an embossed sheet is preferably about 1.1 to 3 times compared with that of the sheet before embossing, depending on a specific embossing pattern or a sheet material to be used. When embossed spacer sheets are used, a buffering effect thereof to the wafers can be increased.

Using the synthetic paper spacer sheets 5 of the above mentioned type, the wafers 4 were contained in the wafer container 1, which was then vacuum-packaged as a whole. After the package was opened, a test for putting out the wafers 4 from the container 1 was carried out. As a result, it was found that the wafers 4 did not adhere to the spacer sheets 5 and were put out form the container without trouble. Further, using embossed spacer sheets of 120 μm in thickness prepared from a polyethylene sheet of about 50 μm in thickness containing 30% by weight of carbon black, a similar test was repeated. Here again, the wafers 4 did not adhere to the spacer sheets thus prepared.

Figure 6B:
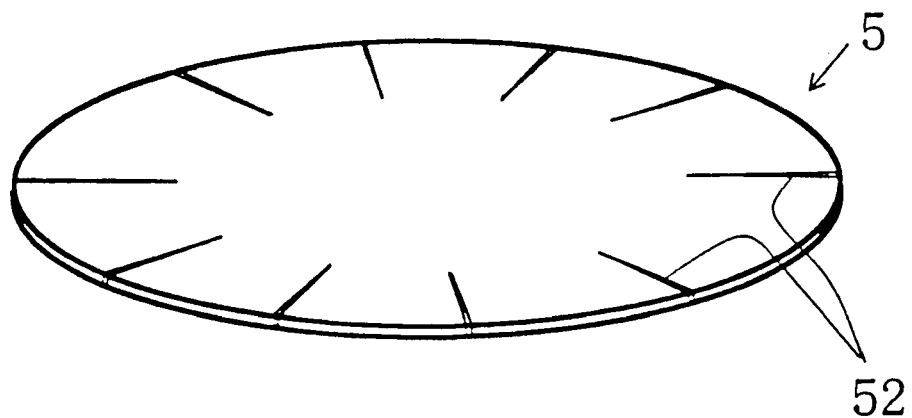

FIG. 6(B) shows a spacer sheet 5 of the above mentioned type in which there are formed a plurality of cut-lines 52 extending from the periphery to inside. Similarly as in the case of the embossed sheet shown in FIG. 6(A), the cut-lines 52 may be formed not only on the spacer sheet 5 of the above mentioned type but applicable to any other sheet. Further, if a structure thereof does not cause adhesion with the wafers 4 essentially or releases such an adhesion easily if occurred, there may be applied any pattern of the cut-lines 52 on the spacer sheet, such as the pattern extending from the periphery to the center as shown in FIG. 6(B) or a similarly extending scroll.

Preferably, number of the cut-lines 52 is 2 to 36, depending on a material of the spacer sheet.

Figure 7:
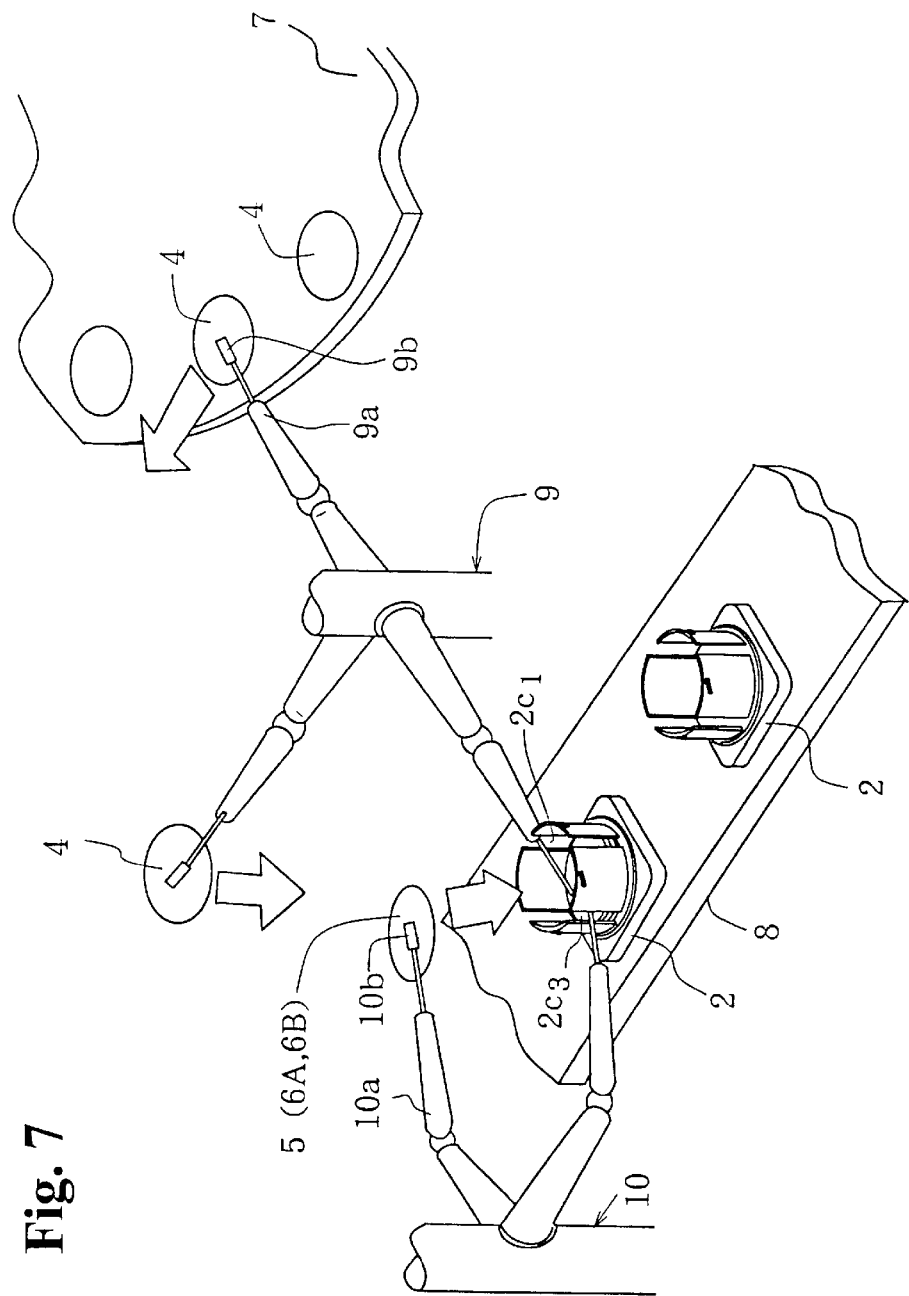
FIG. 7 is a schematic perspective view of a carrier system to which the present method for putting wafers in and/or out of the container can be introduced.
Figure 8:
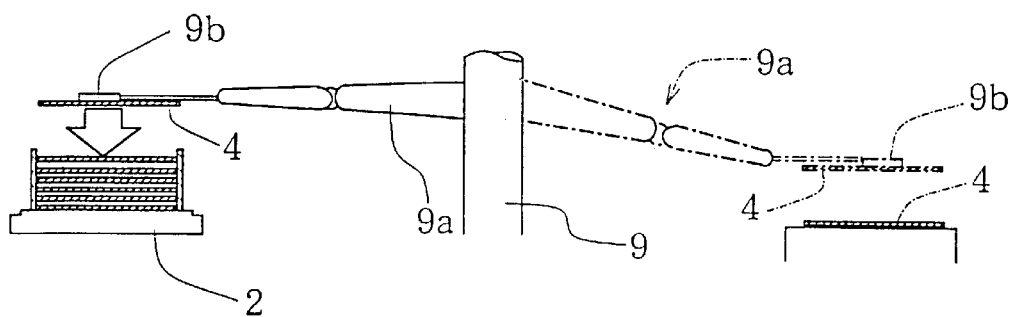
FIG. 8 is a schematic view showing a situation before the wafers are put in the container by means of the carrier system shown in FIG. 7.
Figure 9:
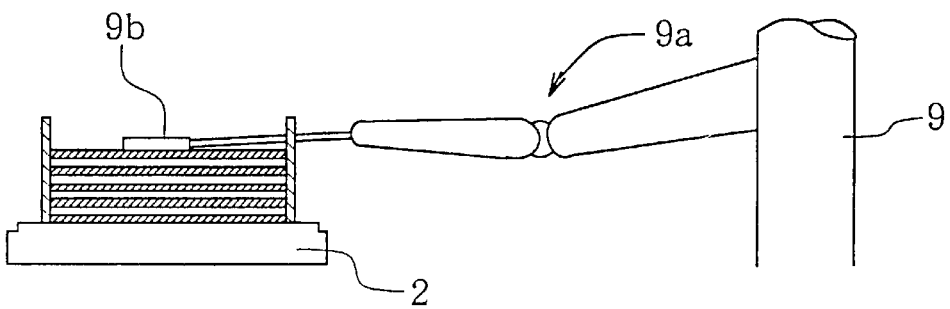
FIG. 9 is a schematic view showing a situation where the wafers are being just put in the container by means of the carrier system shown in FIG. 7.
Figure 10:
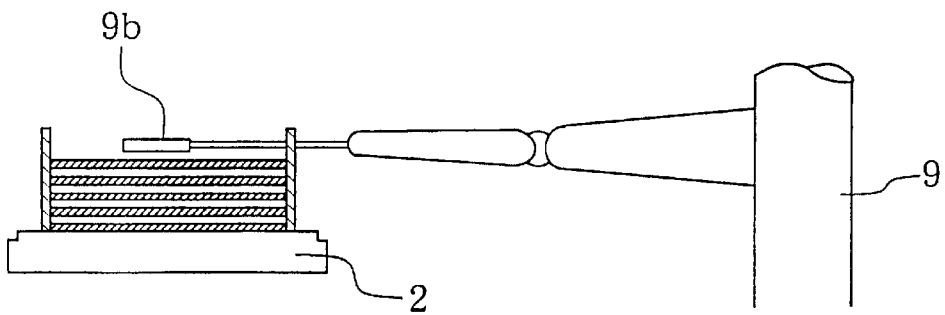
FIG. 10 is a schematic view showing a situation after the wafers have been put in the container by means of the carrier system shown in FIG. 7.

A method for putting the wafers in and/or out of the container of the present invention will be described in an embodiment in which the present method is applied to a wafer carrier system. FIG. 7 is a schematic perspective view of a wafer putting in and/or out system. FIGS. 8, 9 and 10 are schematic views showing procedures for retaining the wafers in order in a container by means of the system.

In FIG. 7, a plurality of the wafers 4 is carried on a conveyer 7 and led to a retaining process successively. On the other hand, a container main body 2 for retaining the wafers 4 is also led to the containing process by means of the other conveyer 8 and waits for the wafers 4 to be retained in order. A carrier robot 9 is arranged between both conveyers 7 and 8, a pickup arm 9a of the robot 9 being provided with a vacuum absobing portion 9b on an end thereof. The wafers 4 carried on the conveyer 7 are absorbed in vacuum by means of the vacuum absorbing portion 9b and then retained in the container main body 2. While, another carrier robot 10 is similarly constructed as the robot 9 and carries and puts the spacer sheets 5 and end-cushioning materials 6A and 6B on a conveyer (not shown) in the container main body 2.

In the above mentioned putting in and/or out system, first of all, an end-cushioning material 6B is put in a vacant container main body 2 carried on the conveyer 8 by means of the carrier robot 10 or by hand. The spacer sheet 5 is absorbed by the vacuum absorbing portion 10b of the carrier robot 10 to put in a containing space 2e of the container main body 2 from upside thereof. In this instance, a pickup arm 10a of the carrier robot 10 can put the absorbed spacer sheet 5 into the bottom of the containing space 2e through a slit (designated by 2c1 in FIG. 7).

An absorbed condition in the vacuum absorbing portion of the pickup arm 10a of the carrier robot 10 is canceled to release the spacer sheet 5 on the bottom of the containing space and to put it on the end-cushioning material 6B, the pickup arm 10a then being sent back to the initial position.

The carrier robot 9 is then operated to absorb the wafer 4 on the conveyer 7 (see, pickup arm 9a drawn by a broken line in FIG. 8), send it up to the container main body 2 (see, pickup arm 9a drawn by a solid line in FIG. 8), drop down the end of the pickup arm 9a in the containing space 2e and release the wafer 4 from an absorbed condition at a level close to the stacked spacer sheet (or a surface contact level with the spacer sheet) (see, FIG. 9). In this situation, the pickup arm 9a of the carrier robot 9 can drop down through a slit (designated by 2c3 in FIG. 7) other than the slit 2c1 of the container main body 2. Such drop of the pickup arm 9 in the containing space 2e may be controlled by means of a distance sensor such as an optical sensor set on the vacuum absorbing portion 9b for distance measurement to the spacer sheet 5 so as to stop the end of the pickup arm at a predetermined level. It is also possible to set a torque sensor on a joint portion of the pickup arm 9a for detecting torque when the wafer 4 is in contact with the spacer sheet 5 so as to stop the pickup arm 9a. The carrier robot 9 goes up in the containing space 2e after releasing the wafer 4 (see, FIG. 10) and returns to the initial position to wait for the next carriage.

Another spacer sheet 5 is then stacked on the wafer 4 contained in the containing main body 2 by means of the carrier robot 10 similarly as described above, and in ths manner, the spacer sheet 5 and the wafer 4 are successively stacked one after the other. When 25 wafers are stacked through the spacer sheets 5 in the container main body 2, the end-cushioning material 6A is finally put therein by means of the carrier robot 10 or by hand to complete the containing or retaining operation. After the containing opperation is completed, the container main body 2 is carried on the conveyer 8, and the lid body 3 is fixed thereto in the subsequent process to complete the whole containing process.

Fixing of the lid body 3 may be automatically carried out together with the wafer containing process or conducted by hand. Further, the wafers 4 and the spacer sheet 5 may either be handled by means of the same robot or put in the container by hand.

A process for putting out the wafers 4 which have been contained in the wafer container is achieved by inversely conducting the above mentioned containing process.

As is described above, the pickup arms 9a and 10a are controlled to stop the ends of both arms 9a and 10a at the uppermost level of the stacked wafer or the spacer sheet by detecting the distance to the uppermost wafer or spacer sheet by means of the distance sensor. However, such a control system may also be conducted as in the following.

The container main body 2 is mounted on a table which is provided with a mechanism for moving vertically upward and downward depending on the thickness of the stacked wafers 4 or spacers 5 as they are put in or out. This makes it possible to always keep the uppermost level of the stacked wafer 4 or spacer 5 at a constant level. Accordingly, the wafers 4 and the spacer sheets 5 can be put in and/or out of the container while keeping the levels of the pickup arms always at the same level.

In the above mentioned putting in and/or out system, positions of the container main body 2, the wafers 4 and the like are correctly controlled and carried by means of each conveyer and robot without any damage or breakage caused by accidental contact of the wafers with the cylindrical portion 2b when the wafers 4 are put in the container main body 2.

According to the retaining structure of the present invention, as the stacked wafers are contained in the container while being held between an elastic material, impact to the container due to dropping or vibration during transportation is absorbed by the elastic material and is not transmitted to the wafers, thereby preventing physical damage or breakage.

Because of the conductive sheets put between the wafers, static elctricity is not generated if friction occurs between the wafers and the spacer sheets due to mechanical vibration during transportation, or such static electricity does not remain in the container if generated. Accordingly, circuits formed on the wafers are not affected electrostatically.

When the spacer sheets have a structure which does not cause adhesion with the wafers essentially or which releases such an adhesion easily if occurred, a put-out operation of the wafers can be conducted smoothly without adhering with the spacer sheets when the wafers are put out of the container.

Further, as a laminate consisting of the elastic material, the spacer sheets and the wafers is kept in the container from both of the upper and the bottom directions, each wafer is kept stably in the container without resulting in positional deviation of mutual wafers, thereby preventing breakage or damage due to accidental contact thereof with an inner wall of the container or generation of static electricity due to friction.

As the slits are formed in the cylindrical portion of the container for putting the wafers in so as to receive the pickup arms of the system for putting the wafers and conductive sheets in and/or out thereof, the wafers can be easily put in the cylindrical portion of the container and put out therefrom. As a result, it is possible to prevent conventional damage or breakage caused by accidental contact of the wafers with the container when the wafers are put in the container by hand, thereby unexpectedly increasing the workability.

What is claimed is:

1. A semiconductor wafer retaining structure, comprising:

a container made of a conductive material in which a plurality of semiconductor wafers is stacked and retained therein, said container including a main body having a square base portion, a plurality of first concentric ribs formed in the base portion, a first cylindrical portion extending upwardly from the base portion outside the reinforcing concentric ribs and having an upper end, a plurality of slits formed in the first cylindrical portion to extend perpendicularly to the base portion, and slant protrusions formed on an upper outer surface of the first cylindrical portion; and a lid body having an upper portion, a second cylindrical portion extending from the upper portion to be located outside the first cylindrical portion when the lid body is assembled with the main body, a square pole portion circumscribed to the second cylindrical portion, a circular channel formed in the upper portion for receiving the upper end of the first cylindrical portion, a plurality of second concentric ribs formed in the upper portion inside the second cylindrical portion, and slant slots formed inside the circular channel to engage the slant protrusions when the lid body is assembled with the main body.

2. A semiconductor wafer retaining structure according to claim 1, wherein said first concentric ribs and the second concentric ribs are arranged symmetrically to each other when the lid body is assembled with the main body so that the container can be used upside down.

3. A semiconductor wafer retaining structure according to claim 2, further comprising spacer sheets to be placed between the semiconductor wafers, and end-cushioning materials to be placed inside the container to sandwich entire semiconductor wafers in the container therebetween.

4. A semiconductor wafer retaining structure according to claim 3, wherein surface resistance of the spacer sheet is $10^6$ $\Omega/\square$ or less.

5. A semiconductor wafer retaining structure according to claim 3, wherein the spacer sheet is synthetic paper of polypyrrole conjugated fiber.

6. A semiconductor wafer retaining structure according to claim 3, wherein the spacer sheet has a plurality of concave portions and convex portions on at least one surface thereof.

7. A semiconductor wafer retaining structure according to claim 3, wherein the spacer sheet has cut-lines cut from a periphery to an inside thereof.

* * * * *